(12) United States Patent
Okerman

(10) Patent No.: US 11,193,977 B2
(45) Date of Patent: Dec. 7, 2021

(54) CIRCUIT INTERRUPTER DIAGNOSTIC SYSTEM

(71) Applicant: EATON INTELLIGENT POWER LIMITED, Dublin (IE)

(72) Inventor: Jason Okerman, Pittsburgh, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 16/847,804

(22) Filed: Apr. 14, 2020

(65) Prior Publication Data

US 2020/0241072 A1 Jul. 30, 2020

Related U.S. Application Data

(62) Division of application No. 14/982,549, filed on Dec. 29, 2015, now Pat. No. 10,656,207.

(51) Int. Cl.
*G01R 31/327* (2006.01)

(52) U.S. Cl.
CPC .................. *G01R 31/327* (2013.01)

(58) Field of Classification Search
CPC .... G01R 31/327; G01R 31/00; H02B 13/065; H02B 13/00; H02H 3/04; H02H 3/00
See application file for complete search history.

(56) References Cited

U.S. PATENT DOCUMENTS

| | | |
|---|---|---|
| 5,754,113 A | 5/1998 | Boyer |
| 6,822,765 B1 | 11/2004 | Ohmori et al. |
| 2003/0228151 A1* | 12/2003 | Niiho .............. H04B 10/25758 398/115 |
| 2004/0151503 A1 | 8/2004 | Kashima et al. |
| 2006/0087783 A1* | 4/2006 | Holley ................ H02H 1/0053 361/81 |
| 2007/0063042 A1* | 3/2007 | Lai .......................... G06K 7/12 235/454 |
| 2011/0202151 A1* | 8/2011 | Covaro ............... H05B 47/195 700/90 |
| 2013/0021163 A1 | 1/2013 | Watford |
| 2016/0188763 A1* | 6/2016 | Beiner ..................... G01D 4/00 703/18 |

* cited by examiner

*Primary Examiner* — Hal Kaplan
*Assistant Examiner* — Joseph N Inge
(74) *Attorney, Agent, or Firm* — Eckert Seamans Cherin & Mellott, LLC

(57) ABSTRACT

A system includes a circuit interrupter including a light source structured to output light and a first processor structured to obtain information associated with the circuit interrupter and to control the light source to output light in a pattern representing the information. The system also include an adapter structured to detect light output by the light source, convert the detected light to another form, and to output the converted form of the light and an electronic device structured to receive the converted form of the light. The electronic device includes a second processor structured to convert the converted form of the light into the information.

7 Claims, 2 Drawing Sheets

CIRCUIT INTERRUPTER DIAGNOSTIC SYSTEM

CROSS-REFERENCE TO RELATED APPLICATIONS

This application is a divisional of, and claims priority to U.S. patent application Ser. No. 14/982,549, filed Dec. 21, 2015, entitled, "CIRCUIT INTERRUPTER DIAGNOSTIC SYSTEM", the contents of which are hereby incorporated herein by reference.

BACKGROUND

Field

The disclosed concept relates generally to circuit interrupter diagnostic systems, and more particularly, to circuit interrupter diagnostic systems for obtaining information from circuit interrupters.

Background Information

Circuit interrupters, such as for example and without limitation, circuit breakers, are typically used to protect electrical circuitry from damage due to an overcurrent condition, such as an overload condition, a short circuit, or another fault condition, such as an arc fault or a ground fault. Circuit breakers typically include separable contacts. The separable contacts may be operated either manually by way of an operator handle or automatically in response to a detected fault condition. Typically, such circuit breakers include an operating mechanism, which is designed to rapidly open the separable contacts, and a trip mechanism, such as a trip unit, which senses a number of fault conditions to trip the breaker automatically. Upon sensing a fault condition, the trip unit trips the operating mechanism to a trip state, which moves the separable contacts to their open position.

It is well known to employ trip units which utilize a microprocessor to detect various types of overcurrent trip conditions and provide various protection functions, such as, for example, a long delay trip, a short delay trip, an instantaneous trip, and/or a ground fault trip. The long delay trip function protects the load served by the protected electrical system from overloads and/or overcurrents. The short delay trip function can be used to coordinate tripping of downstream circuit breakers in a hierarchy of circuit breakers. The instantaneous trip function protects the electrical conductors to which the circuit breaker is connected from damaging overcurrent conditions, such as short circuits. As implied, the ground fault trip function protects the electrical system from faults to ground.

Circuit breakers have a variety of related diagnostic information. Some circuit breakers can be physically connected to an electronic device to transfer the diagnostic information from the circuit breaker to the electronic device. However, this process is time-consuming and requires the circuit breaker to have a connector that is accessible to a technician. Some other circuit breakers have a display that can display the diagnostic information. However, this approach is costly. Additionally, the diagnostic information is not transferred from the circuit breaker to another device.

There is thus room for improvement in circuit interrupter diagnostic systems.

SUMMARY

These needs and others are met by embodiments of the disclosed concept, which are directed to a system including a circuit interrupter structured to output a light pattern representing information associated with the circuit interrupter.

In accordance with one aspect of the disclosed concept, a system comprises: a circuit interrupter including: a light source structured to output light; and a first processor structured to obtain information associated with the circuit interrupter and to control the light source to output light in a pattern representing the information; an adapter structured to detect light output by the light source, convert the detected light to another form, and to output the converted form of the light; and an electronic device structured to receive the converted form of the light, the electronic device including: a second processor structured to convert the converted form of the light into the information.

In accordance with another aspect of the disclosed concept, a system comprises: a circuit interrupter including: a light source structured to output light; and a first processor structured to obtain information associated with the circuit interrupter and to control the light source to output light in a pattern representing the information; and an electronic device including: a light sensor structured to detect light output by the light source and to output an electrical signal based on the detected light; and a second processor structured to convert the second electrical signal into the information.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
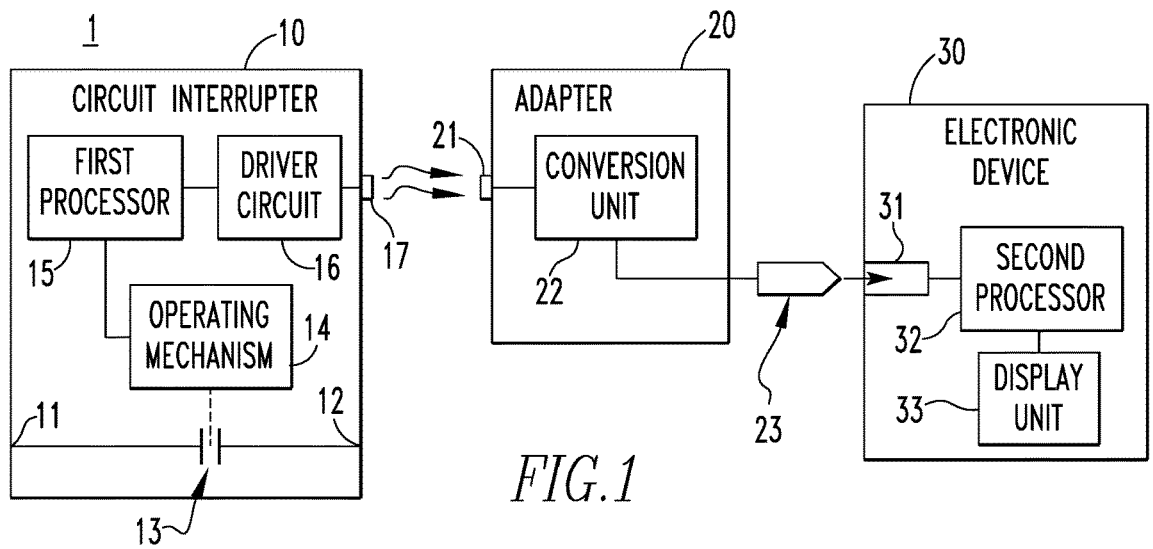
FIG. 1 is a schematic diagram of a circuit interrupter diagnostic system in accordance with an example embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the term "processor" shall mean a programmable analog and/or digital device that can store, retrieve and process data; a controller; a control circuit; a computer; a workstation; a personal computer; a microprocessor; a microcontroller; a microcomputer; a central processing unit; a mainframe computer; a mini-computer; a server; a networked processor; or any suitable processing device or apparatus.

As employed herein, the statement that two or more parts are "coupled" together shall mean that the parts are joined together either directly or joined through one or more intermediate parts.

As employed herein, the term "number" shall mean one or an integer greater than one (i.e., a plurality).

FIG. 1 is a schematic diagram of a circuit interrupter diagnostic system 1 in accordance with an example embodiment of the disclosed concept. The circuit interrupter diagnostic system 1 includes a circuit interrupter 10 (e.g., without limitation, a circuit breaker), an adapter 20 and an electronic device 30.

The circuit interrupter 10 includes a first terminal 11 structured to electrically connect to a power source (not shown) and a second terminal 12 structured to electrically connect to a load (not shown). The circuit interrupter 10 also includes separable contacts 13, an operating mechanism 14, and a first processor 15.

The separable contacts 13 are electrically connected between the first and second terminals 11,12 and are movable between a closed position and an open position. When the separable contacts 13 are closed, the first and second terminals 11,12 are electrically connected. When the separable contacts 13 are open, the first and second terminals 11,12 are electrically disconnected. The operating mechanism 14 is a device structured to trip open the separable contacts 13.

Although separable contacts 13 are disclosed, suitable solid state separable contacts can be employed. For example, the disclosed circuit interrupter 10 includes a suitable circuit interrupter mechanism, such as the separable contacts 13 that are opened and closed by the operating mechanism 14, although the disclosed concept is applicable to a wide range of circuit interruption mechanisms (e.g., without limitation, solid state switches like FET or IGBT devices; contactor contacts) and/or solid state based control/protection devices (e.g., without limitation, drives; soft-starters; DC/DC converters) and/or operating mechanisms (e.g., without limitation, electrical, electro-mechanical, or mechanical mechanisms).

The first processor 15 is structured to detect a fault condition based on input from one or more sensors (not shown) included in the circuit interrupter 10. The fault condition may include, without limitation, an over current, a short circuit, a ground fault, or an arc fault. Based on detection of a fault condition, the first processor 10 controls the operating mechanism 14 to trip open the separable contacts 13. In some example embodiments of the disclosed concept, the first processor 10 forms part of an electronic trip unit.

A memory (not shown) may be associated with the first processor 15 or included as part of the first processor 15. The first processor 15 may be, for example and without limitation, a microprocessor, a microcontroller, or some other suitable processing device or circuitry, that interfaces with the memory. The memory can be any of one or more of a variety of types of internal and/or external storage media such as, without limitation, RAM, ROM, EPROM(s), EEPROM(s), FLASH, and the like that provide a storage register, i.e., a machine readable medium, for data storage such as in the fashion of an internal storage area of a computer, and can be volatile memory or nonvolatile memory.

The first processor 15 is also structured to obtain information associated with the circuit interrupter 10. The information may include a cause of trip of the circuit interrupter 10. However, the information may also include information other than the cause of trip such as, without limitation, information related to the cause of trip that may be beneficial to a technician diagnosing the circuit interrupter 10 or any circuits it is associated with. The information may include, for example and without limitation, a voltage level, a current level, or a peak level prior to a trip, a number of lifetime trips, and high frequency characteristics. The information may also include, without limitation, a logged history of each fault instance and root cause of trip, other various information prior to a trip, a time duration between a fault event and a trip command, or other information not directly related to the most recent fault.

The circuit interrupter 10 further includes a driver circuit 16 and a light source 17. The light source 17 may be any suitable component or components suitable to produce light such as, for example and without limitation, a light emitting diode (LED). It is also contemplated that the light source 17 may include multiple light sources such as, for example and without limitation, multiple LEDs, without departing from the scope of the disclosed concept. The driver circuit 16 is electrically connected to the light source 17 and includes circuitry suitable to drive the light source 17. The first processor 15 is electrically connected to the driver circuit 16 and is structured to control the light source 17, via the driver circuit 16. The driver circuit 16 may control the light source 17 by, for example, pulsing (e.g., turning on or turning off the light source 17) or dimming the light source 17. It is also contemplated that more complex schemes may be employed to control the light source 17 without departing from the scope of the disclosed concept.

The first processor 15 is further structured to encode information associated with the circuit interrupter 10 in a manner suitable for transmission. The first processor 15 is also structured to control the light source 17 (e.g., without limitation, to pulse or dim the light source 17) to output a light pattern representing the information associated with the circuit interrupter 10. The light pattern produced by the light source 17 may be detected and decoded to obtain the information associated with the circuit interrupter 10. It is contemplated that the information may be encoded in any manner suitable for serial single channel transmission. One non-limiting example of serial encoding is the Infrared Data Association (iRDA) standard for television remote controls. However, it will be appreciated by those having ordinary skill in the art that any suitable serial single channel protocol may be employed by the first processor 15 to encode the information without departing from the scope of the disclosed concept.

It is contemplated that in some example embodiments of the disclosed concept, the first processor 15 may control the light source 17 in a manner other than activating and deactivating it to generate the light pattern. For example and without limitation, the first processor 15 can also dim or brighten the light source 17 by different amounts. Moreover, in some example embodiments of the disclosed concept, the light source 17 is capable of changing colors and the first processor 15 can control the light source 17 change colors. Furthermore, in some example embodiments of the disclosed concept, the light source 17 includes more than one component that produces light (e.g., multiple LEDs) and the first processor 15 can activate or deactivate, dim or brighten, and/or change colors of individual light producing components to generate the light pattern.

The circuit interrupter diagnostic system 1 further includes the adapter 20. Adapter 20 is structured to detect light output by the light source 17, convert the detected light to another form (e.g., without limitation, an electrical signal), and to output the converted form of the light. The adapter 20 includes a light sensor 21, a conversion unit 22 and an output connector 23. The light sensor 21 (e.g., without limitation, a photo-resistor) is structured to detect light from the light source 17. The light sensor 21 is electrically connected to the conversion unit 22 and provides the conversion unit 22 with an electrical signal based on the light detected from the light source 17.

The conversion unit 22 is structured to receive the electrical signal representing the detected light from the light sensor 21 and to convert it to another form. In some example embodiments of the disclosed concept, the conversion unit 22 converts the electrical signal representing the detected light into an audio electrical signal that may be received by an audio input port of a device such as the electronic device 30. The conversion of the electrical signal by the conversion unit 22 may involve, for example and without limitation, amplifying or level shifting the electrical signal. The conversion of the electrical signal by the conversion unit 22 may also include, for example and without limitation, encoding the electrical signal in a different manner.

The conversion unit 22 may include a processor (not shown) and a memory (not shown). The processor may be, for example and without limitation, a microprocessor, a microcontroller, or some other suitable processing device or circuitry, that interfaces with the memory. The memory can be any of one or more of a variety of types of internal and/or external storage media such as, without limitation, RAM, ROM, EPROM(s), EEPROM(s), FLASH, and the like that provide a storage register, i.e., a machine readable medium, for data storage such as in the fashion of an internal storage area of a computer, and can be volatile memory or nonvolatile memory.

The conversion unit 22 is electrically connected to the output connector 23 and is structured to output the converted electrical signal to the output connector 23. The output connector 23 is structured to electrically connect to and provide the converted electrical signal to another device such as, without limitation, the electronic device 30.

The circuit interrupter diagnostic system 1 further includes the electronic device 30. The electronic device 30 includes an input connector 31, a second processor 32 and a display unit 33. The input connector 31 is structured to electrically connect to the output connector 23 of the adapter 20 so as to create an electrical connection between the adapter 20 and the electronic device 30. The input connector 31 is structured to receive the converted electrical signal from the output connector 23 and is electrically connected to the second processor 32 so as to provide the converted electrical signal to the second processor 32.

The second processor 32 is structured to receive the converted electrical signal from the input connector 31 and to decode the converted electrical signal so as to obtain the information associated with the circuit interrupter 10 that was originally transmitted as a light pattern from the light source 17. The second processor 32 is also electrically connected to the display unit 33 and is structured to provide the information associated with the circuit interrupter 10 to the display unit 33 in a manner suitable for display. The display unit 33 is structured to display the information associated with the circuit interrupter 10. The display unit 33 may be any suitable type of display.

A memory (not shown) may be associated with the second processor 32 or included as part of the second processor 32. The second processor 32 may be, for example and without limitation, a microprocessor, a microcontroller, or some other suitable processing device or circuitry, that interfaces with the memory. The memory can be any of one or more of a variety of types of internal and/or external storage media such as, without limitation, RAM, ROM, EPROM(s), EEPROM(s), FLASH, and the like that provide a storage register, i.e., a machine readable medium, for data storage such as in the fashion of an internal storage area of a computer, and can be volatile memory or nonvolatile memory.

In accordance with some example embodiments of the disclosed concept, the conversion unit 22 is structured to convert the electrical signal based on the light pattern to an electrical audio signal. Also, in accordance with this example embodiment of the disclosed concept, the output connector 23 is an audio output jack and the input connector 31 is an audio input port. Further, in accordance with this example embodiment of the disclosed concept, the electronic device 30 is a mobile device, such as a smartphone, and the input connector 31 is a headphone input port of the mobile device.

It is contemplated that in some exemplary embodiments of the disclosed concept, the conversion unit 22 may convert the electrical signal to comply with other types of electrical protocols such as, without limitation, universal serial bus (USB), standardized serial protocol, ethernet, or other types of electrical protocols without departing from the scope of the disclosed concept.

Figure 2:
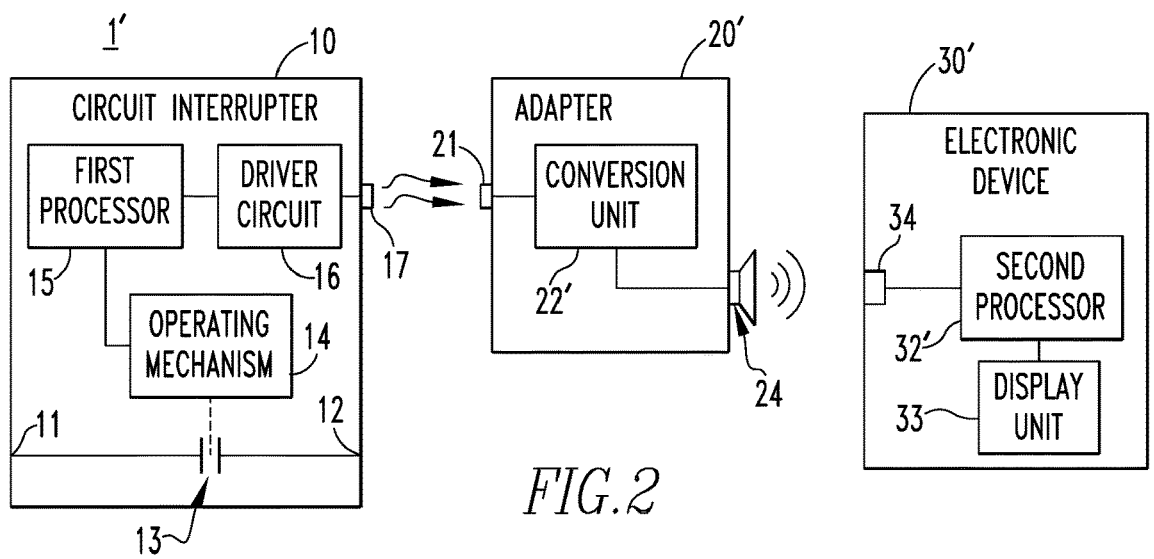
FIG. 2 is a schematic diagram of a circuit interrupter diagnostic system in accordance with another example embodiment of the disclosed concept.

FIG. 2 is a schematic diagram of a circuit interrupter diagnostic system 1' in accordance with another example embodiment of the disclosed concept. The circuit interrupter diagnostic system 1' of FIG. 2 includes a circuit interrupter 10, an adapter 20' and an electronic device 30'. The circuit interrupter 10 in the example embodiment of FIG. 2 is the same as the circuit interrupter 10 in the example embodiment of FIG. 1. For economy and clarity of disclosure, a repeated description of the circuit interrupter 10 is omitted.

The adapter 20' is structured to detect light output by the light source 17, convert the detected light to another form (e.g., without limitation, an audible sound), and to output the converted form of the light. The adapter 20' includes a light sensor 21, a conversion unit 22' and a speaker 24. The light sensor 21 (e.g., without limitation, a photo-resistor) is structured to detect light from the light source 17. The light sensor 21 is electrically connected to the conversion unit 22' and provides the conversion unit 22' with an electrical signal based on the light detected from the light source 17.

The conversion unit 22' is structured to receive the electrical signal from the light sensor 21 and to convert it to an audio output signal. The audio output signal is a signal that is suitable to be output from the speaker 24. The conversion of the electrical signal by the conversion unit 22' to the audio output signal may involve, for example and without limitation, amplifying or level shifting the electrical signal. The conversion of the electrical signal by the conversion unit 22' to the audio output signal may also include, for example and without limitation, encoding the electrical signal in a different manner.

The conversion unit 22' is electrically connected to the speaker 24 and is structured provide the audio output signal to the speaker 24. The speaker 24 is structured to output an audible sound based on the audio output signal. The speaker 24 may be any type of speaker that is suitable to output an audible sound.

The electronic device 30' includes a microphone 34, a second processor 32' and a display unit 33. The microphone 34 is structured to detect the audible sound output by the speaker 24 and to output a second electrical signal based on the detected audible sound. The microphone 34 is also electrically connected to the second processor 32' and is structured to provide the second electrical signal to the second processor 32'.

The second processor 32' is structured to receive the second electrical signal from the microphone 34 and to decode the second electrical signal so as to obtain the information associated with the circuit interrupter 10 that was originally transmitted as a light pattern from the light source 17. The second processor 32' is also electrically connected to the display unit 33 and is structured to provide the information associated with the circuit interrupter 10 to the display unit 33 in a manner suitable for display. The display unit 33 is structured to display the information associated with the circuit interrupter 10. The display unit 33 may be any suitable type of display.

In accordance with an example embodiment of the disclosed concept, the electronic device 30' is a mobile device, such as a smartphone, and the microphone 34 is the microphone of the smartphone. Also, in accordance with some example embodiments of the disclosed concept, the adapter 20' is structured to be attached to the circuit interrupter 10 and disposed such that the light sensor 21 can detect the light pattern output by the light source 17.

Figure 3:
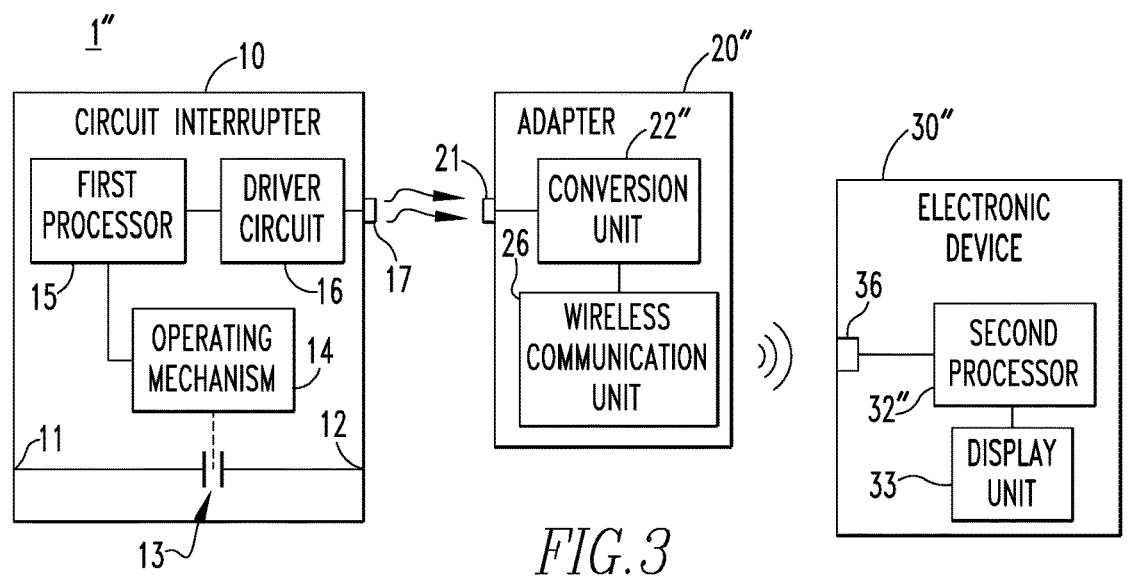
FIG. 3 is a schematic diagram of a circuit interrupter diagnostic system in accordance with another example embodiment of the disclosed concept.

FIG. 3 is a schematic diagram of a circuit interrupter diagnostic system 1" in accordance with another example embodiment of the disclosed concept. The circuit interrupter diagnostic system 1" of FIG. 2 includes a circuit interrupter 10, an adapter 20" and an electronic device 30". The circuit interrupter 10 in the example embodiment of FIG. 3 is the same as the circuit interrupter 10 in the example embodiment of FIG. 1. For economy and clarity of disclosure, a repeated description of the circuit interrupter 10 is omitted.

The adapter 20" is structured to detect light output by the light source 17, convert the detected light to another form (e.g., without limitation, an wireless electromagnetic signal), and to output the converted form of the light. The adapter 20" includes a light sensor 21, a conversion unit 22" and a wireless communication unit 26. The light sensor 21 (e.g., without limitation, a photo-resistor) is structured to detect light from the light source 17. The light sensor 21 is electrically connected to the conversion unit 22" and provides the conversion unit 22" with an electrical signal based on the light detected from the light source 17.

The conversion unit 22" is structured to receive the electrical signal from the light sensor 21 and to convert it to another electrical signal suitable for wireless transmission. The conversion of the electrical signal by the conversion unit 22" may involve, for example and without limitation, amplifying or level shifting the electrical signal. The conversion of the electrical signal by the conversion unit 22" may also include, for example and without limitation, encoding the electrical signal in a different manner.

The conversion unit 22" is electrically connected to the wireless communication unit 26 and is structured provide the audio output signal to the wireless communication unit 26. The wireless communication unit 26 is structured to output a wireless electromagnetic signal based on the electrical signal. The wireless communication unit 26 may transmit the wireless electromagnetic signal in accordance with any suitable wireless communication protocol such as, without limitation, Bluetooth, wi-fi, z-wave, or any other suitable wireless communication protocol.

The electronic device 30" includes a wireless receiver 36, a second processor 32" and a display unit 33. The wireless receiver 36 is structured to receive the wireless electromagnetic signal from the wireless communication unit 26 and to output an electrical signal based on the received wireless electromagnetic signal. The wireless receiver 36 is also electrically connected to the second processor 32" and is structured to provide the electrical signal to the second processor 32".

The second processor 32" is structured to receive the electrical signal from the wireless receiver 36 and to decode the second electrical signal so as to obtain the information associated with the circuit interrupter 10 that was originally transmitted as a light pattern from the light source 17. The second processor 32" is also electrically connected to the display unit 33 and is structured to provide the information associated with the circuit interrupter 10 to the display unit 33 in a manner suitable for display. The display unit 33 is structured to display the information associated with the circuit interrupter 10. The display unit 33 may be any suitable type of display. In accordance with an example embodiment of the disclosed concept, the electronic device 30" is a mobile device, such as a smartphone, and the microphone 34 is the microphone of the smartphone.

Figure 4:
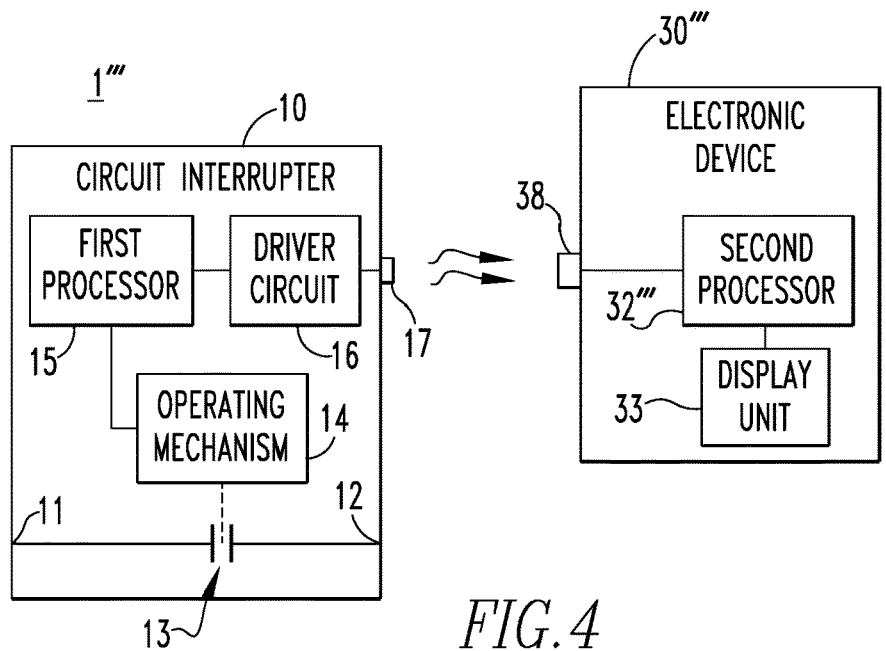
FIG. 4 is a schematic diagram of a circuit interrupter diagnostic system in accordance with another example embodiment of the disclosed concept.

FIG. 4 is a schematic diagram of a circuit interrupter diagnostic system 1''' in accordance with another example embodiment of the disclosed concept. The circuit interrupter diagnostic system 1''' of FIG. 4 includes a circuit interrupter 10 and an electronic device 30'''. The circuit interrupter 10 in the example embodiment of FIG. 4 is the same as the circuit interrupter 10 in the example embodiment of FIG. 1. For economy and clarity of disclosure, a repeated description of the circuit interrupter 10 is omitted.

The electronic device 30''' includes a light sensor 38, a second processor 32''' and a display unit 33. The light sensor 38 (e.g., without limitation, a camera) is structured to detect light from the light source 17. The light sensor 38 is electrically connected to the second processor 32''' and provides the second processor 32''' with an electrical signal based on the light detected from the light source 17.

The second processor 32''' is structured to receive the electrical signal from the light sensor 38 and to decode the electrical signal so as to obtain the information associated with the circuit interrupter 10 that was originally transmitted as a light pattern from the light source 17. The second processor 32''' is also electrically connected to the display unit 33 and is structured to provide the information associated with the circuit interrupter 10 to the display unit 33 in a manner suitable for display. The display unit 33 is structured to display the information associated with the circuit interrupter 10. The display unit 33 may be any suitable type of display.

In accordance with an example embodiment of the disclosed concept, the electronic device 30''' is a mobile device, such as a smartphone, and the light sensor 38 is the camera of the smartphone.

Figure 5:
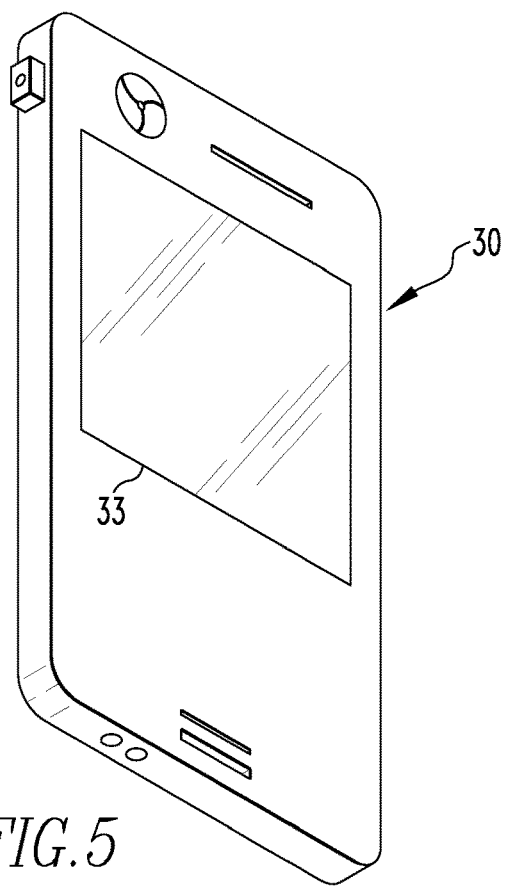
FIG. 5 is an isometric view of an electronic device in accordance with an example embodiment of the disclosed concept.

FIG. 5 is an isometric view of the electronic device 30 in accordance with an exemplary embodiment of the disclosed concept. As shown in FIG. 5, the electronic device 30 may be a mobile device, such as a smartphone, and the display unit 33 may include a display of the mobile device. However, it will be appreciated that the electronic device 30 may be other types of devices such as, without limitation, a tablet or a computer, without departing from the scope of the disclosed concept.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A system comprising:
   a circuit interrupter including:
      a light source structured to output light; and
      a first processor structured to obtain information associated with the circuit interrupter and to control the light source to output light in a pattern representing the information, wherein the first processor controls the light source changing colors of individual light producing components to generate the light pattern; and
   an electronic device including:
      a light sensor structured to detect light output by the light source and to output an electrical signal based on the detected light; and
      a second processor structured to convert the electrical signal into the information associated with the circuit interrupter.

2. The system of claim 1, wherein the electronic device is a smartphone; and
   wherein the light sensor is a camera.

3. The system of claim 1, wherein the information associated with the circuit interrupter includes information other than a cause of trip.

4. The system of claim 3, wherein the information associated with the circuit interrupter includes at least one of a voltage level, a current level, or a peak level prior to a trip, a number of lifetime trips, and high frequency characteristics.

5. The system of claim 1, wherein the electronic device further includes a display unit electrically connected to the second processor and structured to display the information.

6. The system of claim 1, wherein the circuit interrupter further includes a first terminal, a second terminal, separable contacts electrically connected between the first terminal and the second terminal, and an operating mechanism structured to trip open the separable contacts.

7. The system of claim 6, wherein the first processor is structured to detect a fault condition and to control the operating mechanism to trip open the separable contacts based on the detected fault condition.

* * * * *